United States Patent
Groe et al.

(10) Patent No.: US 7,609,118 B1
(45) Date of Patent: Oct. 27, 2009

(54) PHASE-LOCKED LOOP CALIBRATION SYSTEM

(75) Inventors: John Groe, Poway, CA (US); Carrie Lo, Newport Coast, CA (US)

(73) Assignee: Sequoia Communications, San Diego, CA (US)

( * ) Notice: Subject to any disclaimer, the term of this patent is extended or adjusted under 35 U.S.C. 154(b) by 0 days.

(21) Appl. No.: 11/027,711

(22) Filed: Dec. 29, 2004

Related U.S. Application Data

(60) Provisional application No. 60/533,524, filed on Dec. 29, 2003.

(51) Int. Cl.
*H03L 7/00* (2006.01)
(52) U.S. Cl. .............................. 331/16; 331/34; 331/17
(58) Field of Classification Search .................... 331/16, 331/1 A, 34, 17
See application file for complete search history.

(56) References Cited

U.S. PATENT DOCUMENTS

| | | | |
|---|---|---|---|
| 4,263,560 A | 4/1981 | Ricker | |
| 4,430,627 A | 2/1984 | Machida | |
| 4,769,588 A | 9/1988 | Panther | |
| 4,816,772 A | 3/1989 | Klotz | |
| 4,926,135 A | 5/1990 | Voorman | |
| 4,965,531 A | 10/1990 | Riley | |
| 5,006,818 A | 4/1991 | Koyama et al. | |
| 5,015,968 A | 5/1991 | Podell et al. | |
| 5,030,923 A | 7/1991 | Arai | |
| 5,289,136 A | 2/1994 | DeVeirman et al. | |
| 5,331,292 A | 7/1994 | Worden et al. | |
| 5,399,990 A | 3/1995 | Miyake | |
| 5,491,450 A | 2/1996 | Helms et al. | |
| 5,508,660 A | 4/1996 | Gersbach et al. | |
| 5,548,594 A | 8/1996 | Nakamura | |
| 5,561,385 A | 10/1996 | Choi | |
| 5,581,216 A | 12/1996 | Ruetz | |
| 5,625,325 A | 4/1997 | Rotzoll et al. | |
| 5,631,587 A * | 5/1997 | Co et al. ..................... | 327/107 |
| 5,648,744 A | 7/1997 | Prakash et al. | |
| 5,677,646 A | 10/1997 | Entrikin | |
| 5,739,730 A | 4/1998 | Rotzoll | |
| 5,767,748 A | 6/1998 | Nakao | |
| 5,818,303 A | 10/1998 | Oishi et al. | |
| 5,834,987 A | 11/1998 | Dent | |
| 5,862,465 A | 1/1999 | Ou | |
| 5,878,101 A | 3/1999 | Aisaka | |
| 5,880,631 A | 3/1999 | Sahota | |
| 5,939,922 A | 8/1999 | Umeda | |
| 5,945,855 A | 8/1999 | Momtaz | |
| 5,949,286 A | 9/1999 | Jones | |
| 5,990,740 A | 11/1999 | Groe | |
| 5,994,959 A | 11/1999 | Ainsworth | |
| 5,999,056 A | 12/1999 | Fong | |
| 6,011,437 A | 1/2000 | Sutardja et al. | |
| 6,018,651 A | 1/2000 | Bruckert et al. | |
| 6,031,425 A | 2/2000 | Hasegawa | |

(Continued)

*Primary Examiner*—Arnold Kinkead
(74) *Attorney, Agent, or Firm*—Cooley Godward Kronish LLP

(57) ABSTRACT

Phase locked loop calibration system. Apparatus is provided for calibration of a phase-locked loop. The apparatus includes logic to calibrate an integration filter of the phase-locked loop, and logic to calibrate a charge pump current of the phase-locked loop, wherein the integration filter and charge pump current are calibrated to achieve a desired phase-locked loop performance level.

13 Claims, 7 Drawing Sheets

U.S. PATENT DOCUMENTS

| | | | |
|---|---|---|---|
| 6,044,124 A | 3/2000 | Monahan et al. | |
| 6,052,035 A | 4/2000 | Nolan et al. | |
| 6,057,739 A * | 5/2000 | Crowley et al. | 331/14 |
| 6,060,935 A | 5/2000 | Shulman | |
| 6,091,307 A | 7/2000 | Nelson | |
| 6,100,767 A | 8/2000 | Sumi | |
| 6,114,920 A | 9/2000 | Moon et al. | |
| 6,163,207 A | 12/2000 | Kattner et al. | |
| 6,173,011 B1 | 1/2001 | Rey et al. | |
| 6,191,956 B1 | 2/2001 | Foreman | |
| 6,204,728 B1 | 3/2001 | Hageraats | |
| 6,211,737 B1 | 4/2001 | Fong | |
| 6,229,374 B1 | 5/2001 | Tammone, Jr. | |
| 6,246,289 B1 | 6/2001 | Pisati et al. | |
| 6,255,889 B1 | 7/2001 | Branson | |
| 6,259,321 B1 | 7/2001 | Song et al. | |
| 6,288,609 B1 | 9/2001 | Brueske et al. | |
| 6,298,093 B1 | 10/2001 | Genrich | |
| 6,333,675 B1 | 12/2001 | Saito | |
| 6,370,372 B1 | 4/2002 | Molnar et al. | |
| 6,392,487 B1 | 5/2002 | Alexanian | |
| 6,404,252 B1 | 6/2002 | Wilsch | |
| 6,476,660 B1 | 11/2002 | Visocchi et al. | |
| 6,515,553 B1 | 2/2003 | Filiol et al. | |
| 6,559,717 B1 | 5/2003 | Lynn et al. | |
| 6,560,448 B1 | 5/2003 | Baldwin et al. | |
| 6,571,083 B1 | 5/2003 | Powell, II et al. | |
| 6,577,190 B2 | 6/2003 | Kim | |
| 6,583,671 B2 | 6/2003 | Chatwin | |
| 6,583,675 B2 | 6/2003 | Gomez | |
| 6,639,474 B2 | 10/2003 | Asikainen et al. | |
| 6,664,865 B2 | 12/2003 | Groe et al. | |
| 6,667,663 B2 * | 12/2003 | Ozawa | 331/17 |
| 6,683,509 B2 | 1/2004 | Albon et al. | |
| 6,693,977 B2 | 2/2004 | Katayama et al. | |
| 6,703,887 B2 | 3/2004 | Groe | |
| 6,711,391 B1 | 3/2004 | Walker et al. | |
| 6,724,235 B2 | 4/2004 | Costa et al. | |
| 6,724,265 B2 * | 4/2004 | Humphreys | 331/17 |
| 6,734,736 B2 | 5/2004 | Gharpurey | |
| 6,744,319 B2 | 6/2004 | Kim | |
| 6,751,272 B1 | 6/2004 | Burns et al. | |
| 6,753,738 B1 | 6/2004 | Baird | |
| 6,763,228 B2 | 7/2004 | Prentice et al. | |
| 6,774,740 B1 | 8/2004 | Groe | |
| 6,777,999 B2 | 8/2004 | Kanou et al. | |
| 6,781,425 B2 | 8/2004 | Si | |
| 6,795,843 B1 | 9/2004 | Groe | |
| 6,798,290 B2 | 9/2004 | Groe et al. | |
| 6,801,089 B2 | 10/2004 | Costa et al. | |
| 6,845,139 B2 | 1/2005 | Gibbons | |
| 6,856,205 B1 | 2/2005 | Groe | |
| 6,870,411 B2 * | 3/2005 | Shibahara et al. | 327/156 |
| 6,917,719 B2 | 7/2005 | Chadwick | |
| 6,940,356 B2 | 9/2005 | McDonald, II et al. | |
| 6,943,600 B2 * | 9/2005 | Craninckx | 327/157 |
| 6,975,687 B2 | 12/2005 | Jackson et al. | |
| 6,985,703 B2 | 1/2006 | Groe et al. | |
| 6,990,327 B2 | 1/2006 | Zheng et al. | |
| 7,015,735 B2 * | 3/2006 | Kimura et al. | 327/157 |
| 7,062,248 B2 | 6/2006 | Kuiri | |
| 7,065,334 B1 | 6/2006 | Otaka et al. | |
| 7,088,979 B1 | 8/2006 | Shenoy et al. | |
| 7,123,102 B2 | 10/2006 | Uozumi et al. | |
| 7,142,062 B2 | 11/2006 | Vaananen et al. | |
| 7,148,764 B2 | 12/2006 | Kasahara et al. | |
| 7,171,170 B2 | 1/2007 | Groe et al. | |
| 7,215,215 B2 | 5/2007 | Hirano et al. | |
| 2002/0071497 A1 | 6/2002 | Bengtsson et al. | |
| 2002/0135428 A1 | 9/2002 | Gomez | |
| 2002/0193009 A1 | 12/2002 | Reed | |
| 2003/0078016 A1 | 4/2003 | Groe et al. | |
| 2003/0092405 A1 | 5/2003 | Groe et al. | |
| 2003/0118143 A1 | 6/2003 | Bellaouar et al. | |
| 2003/0197564 A1 | 10/2003 | Humphreys et al. | |
| 2004/0017862 A1 | 1/2004 | Redman-White | |
| 2004/0051590 A1 | 3/2004 | Perrott et al. | |
| 2005/0093631 A1 | 5/2005 | Groe | |
| 2005/0099232 A1 | 5/2005 | Groe et al. | |
| 2006/0003720 A1 | 1/2006 | Lee et al. | |

* cited by examiner

"Prior Art"

PHASE-LOCKED LOOP CALIBRATION SYSTEM

CROSS REFERENCE TO RELATED APPLICATIONS

The present Application claims the benefit of priority from a co-pending U.S. Provisional Patent Application entitled "Phase Locked Loop Calibration System" having Ser. No. 60/533,524 and filed on Dec. 29, 2003, the disclosure of which is incorporated by reference herein for all purposes.

FIELD

The present invention relates generally to the calibration of a phase locked loop, and more particularly, to a system for precisely setting the loop gain, phase margin, and stability associated with a phase-locked loop.

BACKGROUND

Phase-locked loops (PLL) find widespread use in frequency synthesizers, clock recovery circuits, phase modulators, and frequency demodulators. Generally, a PLL consists of a voltage-controlled oscillator (VCO), counter, phase/frequency detector (P/FD), charge pump (CP), and low pass filter as shown in FIG. 1. The PLL uses feedback to track the phase of the input signal and generate a replica signal, usually offset in frequency.

The behavior of a phase-locked loop system depends on the parameters associated with each of the comprising circuits. These parameters vary with process and affect the system's performance—even its stability. It would therefore be advantageous to have a system to precisely set the phase-locked loop's operating parameters.

SUMMARY

In one or more embodiments, a PLL calibration system is provided to automatically calibrate the parameters of a phase-locked loop and thereby optimize its performance for a variety of applications. In one or more embodiments, the system operates to precisely calibrate the integration filter and charge pump current of a PLL to achieve a desired PLL transfer function and performance level. For example, the calibration system calibrates the PLL's integration filter to set the correct Zero/pole locations, and calibrates the charge pump current to compensate for gain characteristics of the PLL's VCO and/or integration filter.

In one embodiment, apparatus is provided for calibration of a phase-locked loop. The apparatus comprises logic to calibrate an integration filter of the phase-locked loop, and logic to calibrate a charge pump current of the phase-locked loop, wherein the integration filter and charge pump current are calibrated to achieve a desired phase-locked loop performance level.

In one embodiment, apparatus is provided for calibration of a phase-locked loop. The apparatus comprises means for calibrating an integration filter of the phase-locked loop, and means for calibrating a charge pump current of the phase-locked loop, wherein the integration filter and charge pump current are calibrated to achieve a desired phase-locked loop performance level.

In one embodiment, a communication device is provide that comprises apparatus for calibration of a phase-locked loop. The apparatus comprises logic to calibrate an integration filter of the phase-locked loop, and logic to calibrate a charge pump current of the phase-locked loop, wherein the integration filter and charge pump current are calibrated to achieve a desired phase-locked loop performance level.

BRIEF DESCRIPTION OF THE DRAWINGS

The foregoing aspects and the attendant advantages of the embodiments described herein will become more readily apparent by reference to the following detailed description when taken in conjunction with the accompanying drawings wherein.

DETAILED DESCRIPTION

In one or more embodiments, a PLL calibration system is provided to automatically calibrate the parameters of a phase-locked loop.

Figure 1:
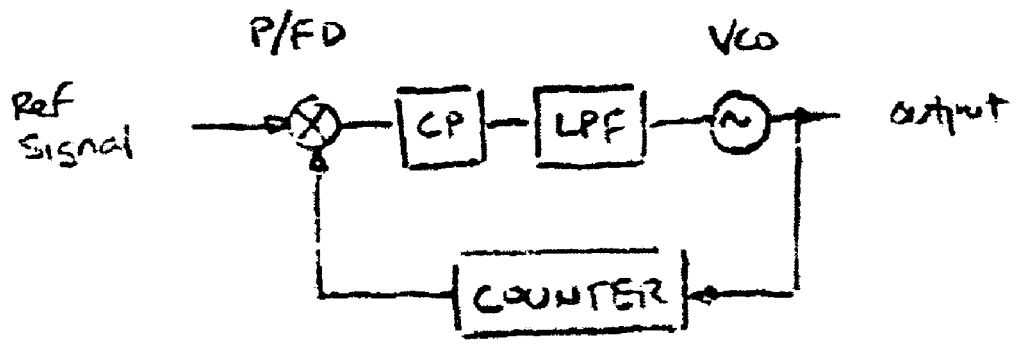
FIG. 1 shows a diagram of a typical PLL.
Figure 2:
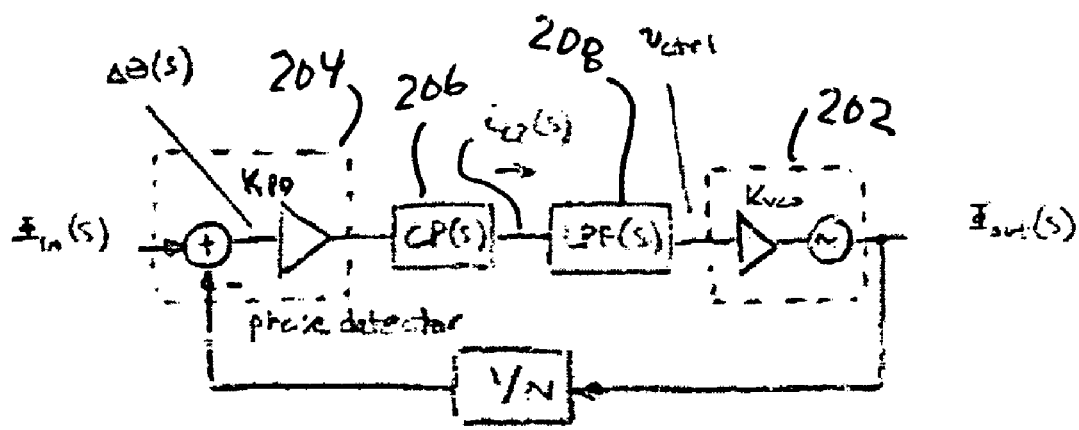
FIG. 2 shows a mathematical model of the PLL of FIG. 2.

FIG. 2 shows a mathematical model of the PLL of FIG. 1. The voltage-controlled oscillator 202 produces an output signal at a frequency set by the control voltage $v_{ctrl}$ according to;

$$v_{out}(t) = A_c \cos(\omega_{free} t + K_{vco} \int v_{ctrl}(t) dt)$$

where $\omega_{free}$ is the free-running frequency of the oscillator and $K_{vco}$ is its associated gain.

The gain $K_{vco}$ describes the relationship between the excess phase of the carrier $\Phi_{out}(s)$ and the control voltage $v_{ctrl}$, which can be expressed as $$\frac{\Phi_{out}(s)}{v_{ctrl}(s)} = \frac{K_{vco}}{s}$$

where $K_{vco}$ is in rads/V. When the phase-locked loop is locked, the phase detector 204 and charge pump circuit 206 generate an output signal $i_{CP}(s)$ that is proportional to the phase difference ($\Delta\theta$) between the two signals input to the phase detector 204. The output signal of the charge pump 206 ($i_{CP}(s)$) can therefore be expressed as;

$$i_{CP}(s) = K_{pd} \frac{\Delta\theta(s)}{2\pi}$$

where $K_{pd}$ is in A/rads and $\Delta\theta$ is in rads. The output signal $i_{CP}(s)$ is input to an integration filter 208, which filters it to produce the control voltage $v_{ctrl}$.

Figure 3:
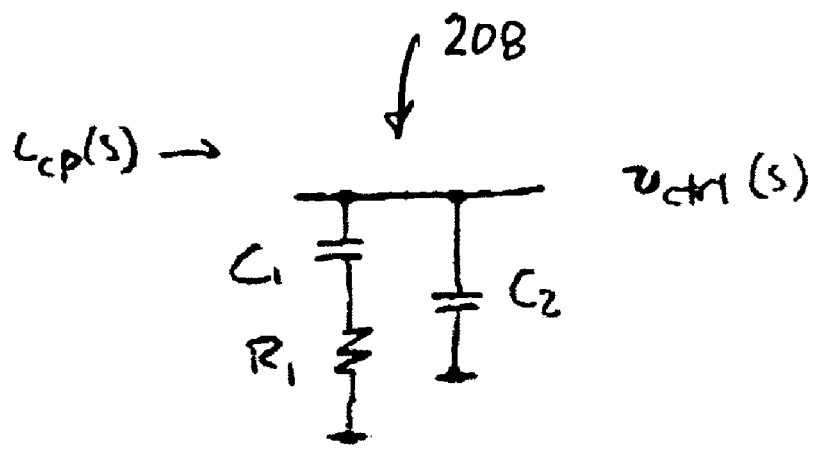
FIG. 3 shows one embodiment of a passive low pass filter or integration filter.

FIG. 3 shows one embodiment of the integration filter 208, which comprises resistor $R_1$ with capacitors $C_1$ and $C_2$ that transforms the signal $i_{CP}(s)$ to the control voltage $v_{ctrl}$ as follows;

$$v_{ctrl}(s) = i_{out}(s)\left(\frac{sR_1C_1 + 1}{s^2R_1C_1C_2 + s(C_1 + C_2)}\right)$$

where a zero (at $1/R_1C_1$) has been added to stabilize the second order system and the capacitor $C_2$ has been included to reduce any ripple on the output voltage.

Combining the above relationships yields the composite open-loop transfer function;

$$GH(s) = K_{PD} \frac{K_{VCO}}{s} \frac{1}{N} \frac{1}{s}\left(\frac{sR_1C_1 + 1}{sR_1C_1C_2 + C_1 + C_2}\right)$$

which has two poles at the origin (due to the voltage-controlled oscillator 202 and the integration filter 208). This system is referred to as a type II phase-locked loop.

Figure 4:
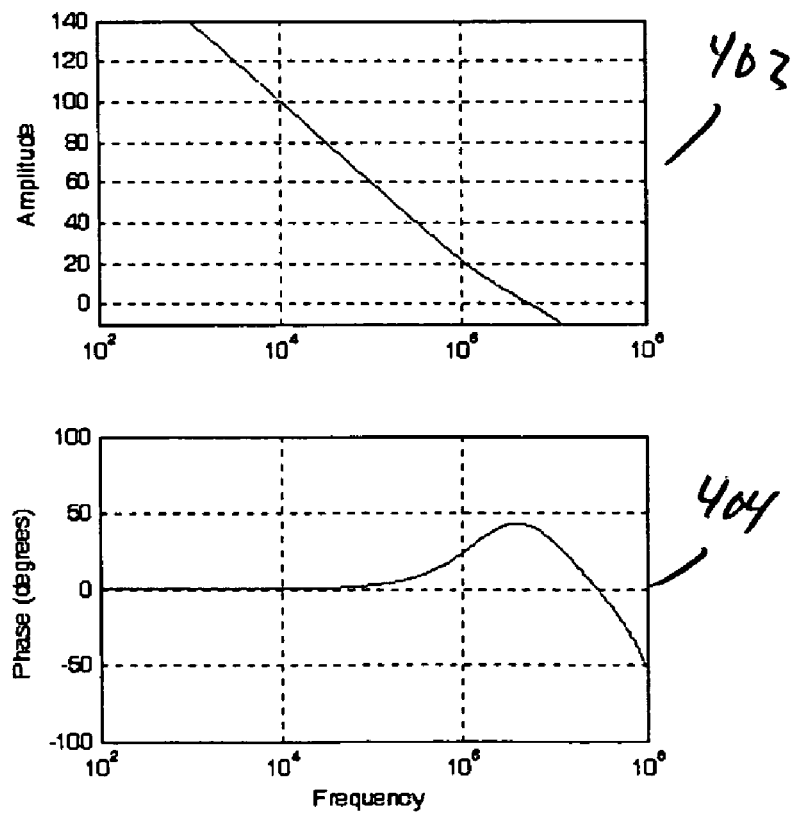
FIG. 4 shows plots of the open-loop magnitude and phase response of the offset-PLL of FIG. 2.

FIG. 4 shows graphs of the open-loop magnitude 402 and phase response 404 of the PLL of FIG. 2. The open-loop transfer function GH(s) is used to analyze the stability of the feedback loop. The graphs of its magnitude 402 and phase response 404 indicate the phase margin of the system. Ideally, the phase margin approaches 45°, providing a closed loop response with adequate stability while minimizing acquisition time.

The loop gain of the phase-locked loop (that is, the gain of the phase-locked loop near dc) depends on four parameters ($I_{CP}$, $K_{vco}$, $R_1$, and N)

$$G_{loop} = |GH(s)|_{s \to dc} = \frac{I_{PD}R_1K_{VCO}}{N}$$

and approximately equals the unity-gain bandwidth of the system. To improve stability, the integration filter's zero shifts the phase slightly before the system's unity gain frequency. The closed-loop response of the system is simply;

$$T(s) = \frac{K_{PD}K_{VCO}N(sR_1C_1 + 1)}{s^2NR_1C_1C_2 + s(K_{PD}K_{VCO}R_1C_1 + C_1 + C_2) + K_{PD}K_{VCO}}$$

which shows the zero and two complex poles. Both the open-loop and closed-loop responses of the phase-locked loop depend on the integration filter components ($R_1$, $C_1$-$C_2$), the charge pump current $I_{CP}$, and the gain of the voltage-controlled oscillator, $K_{vco}$, and the value of the counter in the feedback loop.

Figure 5:
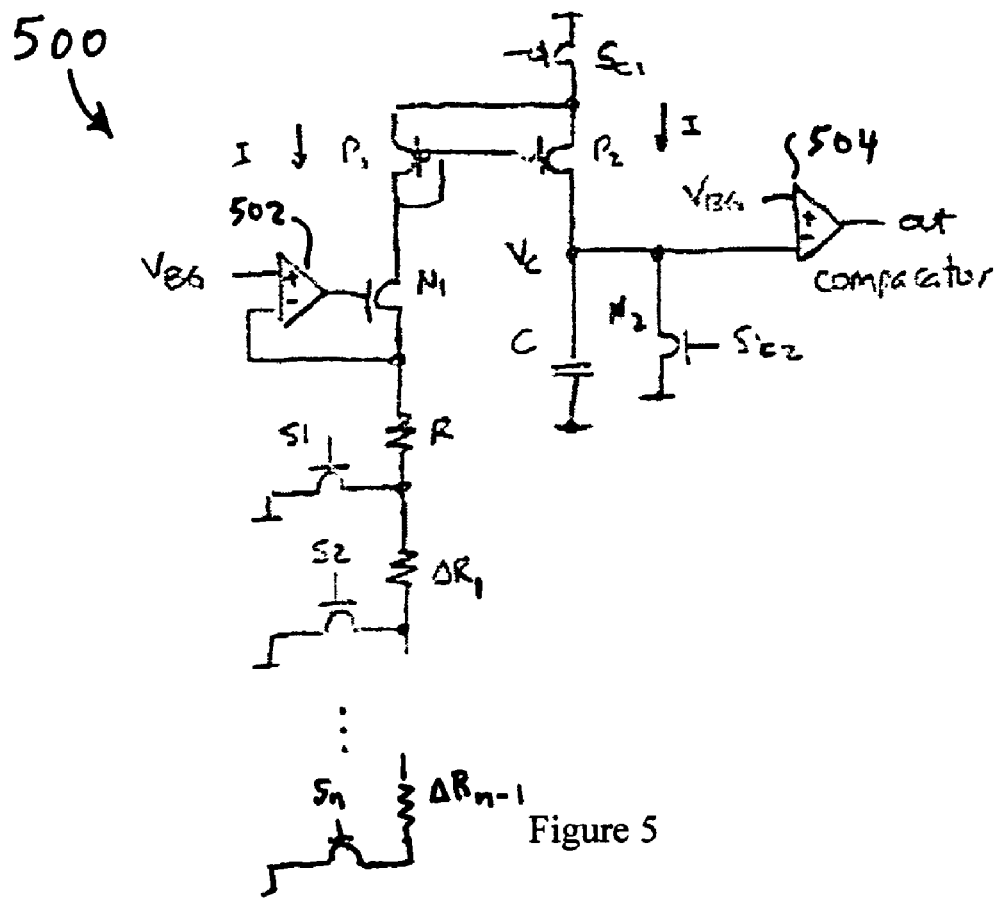
FIG. 5 shows one embodiment of a calibration circuit used to adjust the zero/pole locations for a PLL's integration loop filter.

FIG. 5 shows one embodiment of a circuit 500 that operates to calibrate the $R_1C_1$ product that forms the basis of the integration filter 208 shown in FIG. 3. The circuit 500 comprises switches ($S_1$-$S_n$) and a variable resistor R that comprises incremental resistors ($\Delta R_1$-$\Delta R_{n-1}$). The circuit 500 uses the following relationship to govern the calibration;

$$V_c = \frac{I}{C}\Delta t$$

where I is the charging current, $\Delta t$ is the charging time, and C is the value of the capacitor $C_1$. It assumes the initial voltage on the capacitor is zero, which is forced by switches $S_{c1}$ and $S_{c2}$. The operational amplifier 502, transistor $N_1$, and the variable resistor R establish the charging current;

$$I = \frac{V_{BG}}{R}$$

which is mirrored to the capacitor C by transistors $P_1$-$P_2$. Note that capacitor C matches capacitor $C_1$ in the integration filter 208 shown in FIG. 3. As a result, the voltage $V_C$ developed across the capacitor is;

$$V_c = \frac{V_{BG}}{RC}\Delta t$$

and is solely dependent on the RC product if $\Delta t$ is accurately set.

In one embodiment, a calibration algorithm is provided that starts with resistor R at its minimum value (switch $S_1$ closed), switch $S_{c1}$ opened, and switch $S_{c2}$ closed. A precise clock (such as the reference clock found in most radio systems) closes switch $S_{c1}$ and toggles open switch $S_{c2}$ to allow the current I to charge capacitor C. After a set time, the clock toggles switch $S_{c1}$ open—stopping the charging of capacitor C—and strobes the comparator. If the voltage stored by the capacitor exceeds the bandgap voltage $V_{BG}$, the output of the comparator 504 transitions positive. This causes the algorithm to open switch $S_1$ and close switch $S_2$, increasing the value of resistor R.

The procedure repeats, incrementing the value of R using the switches $S_n$, until the overall value of resistor R (R plus the incremental resistors $\Delta R_n$) causes the comparator output to transition negative. This completes the calibration and sets the RC product.

In one or more embodiments, the calibration algorithm is implemented in hardware, software, firmware, or a combination thereof. For example, any suitable processor may execute software to control the inputs and switches, and monitor the outputs of the circuit 500 to perform the calibration algorithm described herein.

Figure 6:
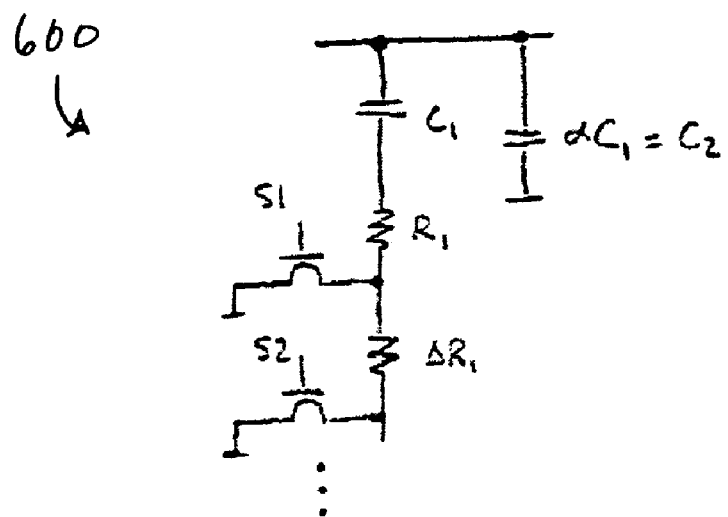
FIG. 6 shows one embodiment of an integration loop filter with adjustable resistor that replicates the operation of the calibration circuit of FIG. 5.

FIG. 6 shows one embodiment of an integration filter 600 that replicates the operation of the calibration circuit shown in FIG. 5. By design, the value of capacitor $C_2$ matches $C_1$ (which is possible using integrated circuit technology, mak ing $C_2=\alpha C_1$) and therefore setting the zero (z) and pole (p) locations to;

$$z = \frac{1}{R_1 C_1} = \frac{1}{V_{BG}\Delta t}$$

$$p = \frac{C_1 + C_2}{R_1 C_1 C_2} = \left(1 + \frac{1}{\alpha}\right)\frac{1}{R_1 C_1} = \left(1 + \frac{1}{\alpha}\right)z$$

Thus, the value of $\Delta t$ sets the zero and pole frequencies.

Figure 7:
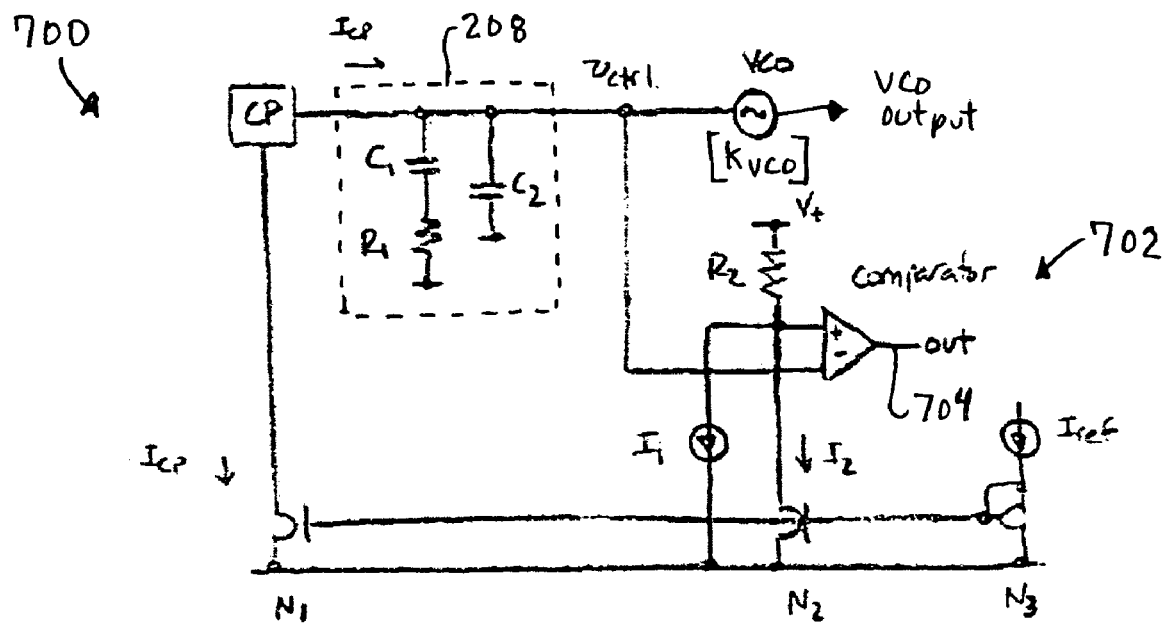
FIG. 7 shows one embodiment of a calibration circuit used to adjust the loop gain and associated parameters of a PLL.
Figure 8:
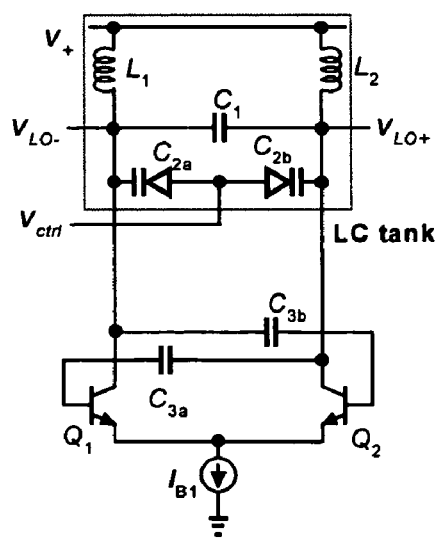
FIG. 8 shows one embodiment of an LC-resonantor voltage-controlled oscillator.

The second half of the calibration system provides an algorithm that targets the product $I_{CP}R_1K_{vco}$. FIG. 7 shows one embodiment of a circuit 700 used to determine the voltage-controlled oscillator's gain ($K_{vco}$). The circuit 700 illustrates a portion of a PLL that comprises a charge pump (CP), integration filter 208, voltage-controlled oscillator (VCO), and gain calibration logic, shown generally at 702. The algorithm first shifts the frequency of the output signal $f_{vco}$ up by decreasing N or the reference frequency $f_{ref}$ since;

$$f_{vco}=(N-\Delta n)f_{ref}=f_{vco}-\Delta f$$

where $\Delta n$ is the adjustment in N and $\Delta f$ is the change in $f_{vco}$ respectively. This is accomplished by adjusting other portions of the PLL not shown. After some time, the phase-locked loop acquires the new frequency $f_{vco}-\Delta f$ and the control voltage $v_{cntrl}$ settles. For example, in the LC-resonantor oscillator shown in FIG. 8, the control voltage $v_{ctrl}$ actually needs to increase to shift the oscillation frequency lower. (This is because the oscillation frequency $f_{vco}$ changes with the varactor's capacitance $C_{2a/b}$, which decreases with lower control voltage $v_{ctrl}$—increasing the oscillation frequency.)

Referring again to FIG. 7, the current $I_1$ is then increased until the comparator output 704 transitions negative. This occurs when $$V_+ - I_1 R_2 = v_{ctrl}$$

and corresponds to the initial value of the control voltage $v_{ctrl}$. Next, the frequency of the output signal $f_{vco}$ is shifted up so that;

$$f_{vco}=(N+\Delta n)f_{ref}=f_{vco}+\Delta f$$

where the change in frequency $2\Delta f$ is sufficient to induce a reasonable change in the control voltage $v_{ctrl}$. The phase-locked loop tracks the frequency shift and eventually settles at a lower control voltage $v_{ctrl}$. The gain of the voltage-controlled oscillator is accordingly;

$$K_{vco} = \frac{2\Delta f}{\Delta v_{ctrl}}$$

where $\Delta v_{ctrl}$ is the change in control voltage. And, as a result $\Delta v_{ctrl}$ indicates the oscillator's gain $K_{vco}$.

The final step in the algorithm increases current $I_{ref}$ until the comparator output 704 again toggles negative. This corresponds to when;

$$V_+ - (I_1+I_2)R_2 = v_{ctrl} \text{ and } I_2 R_2 = \Delta v_{ctrl}$$

and sets $$K_{vco} = \frac{2\Delta f}{I_2 R_2}$$

By design, resistor $R_2$ matches resistor $R_1$ of the integration filter 208 and the current mirror formed by transistors $N_1$-$N_3$ forces charge pump current $I_{CP}$ to track current $I_2$. This means the loop gain equals;

$$G_{loop} = I_{CP}R_1 \frac{2\Delta f}{I_2 R_2} = 2\beta\Delta f$$

where $\beta$ is the fixed relationship between resistors $R_1$-$R_2$ and currents $I_{CP}$-$I_2$.

Figure 9:
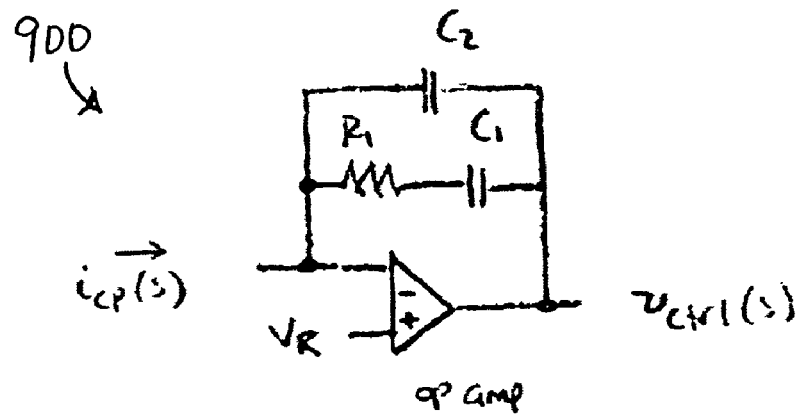
FIG. 9 shows one embodiment of an active loop filter for use with a PLL.

FIG. 9 shows one embodiment of an active circuit 900 used to realize the loop filter or integration filter. For example, the circuit 900 is suitable for use as the integration filter 208. The operational amplifier (op amp) improves the performance of the charge pump circuit by maintaining the voltage seen at its output at or near the voltage $V_R$.

Figure 10:
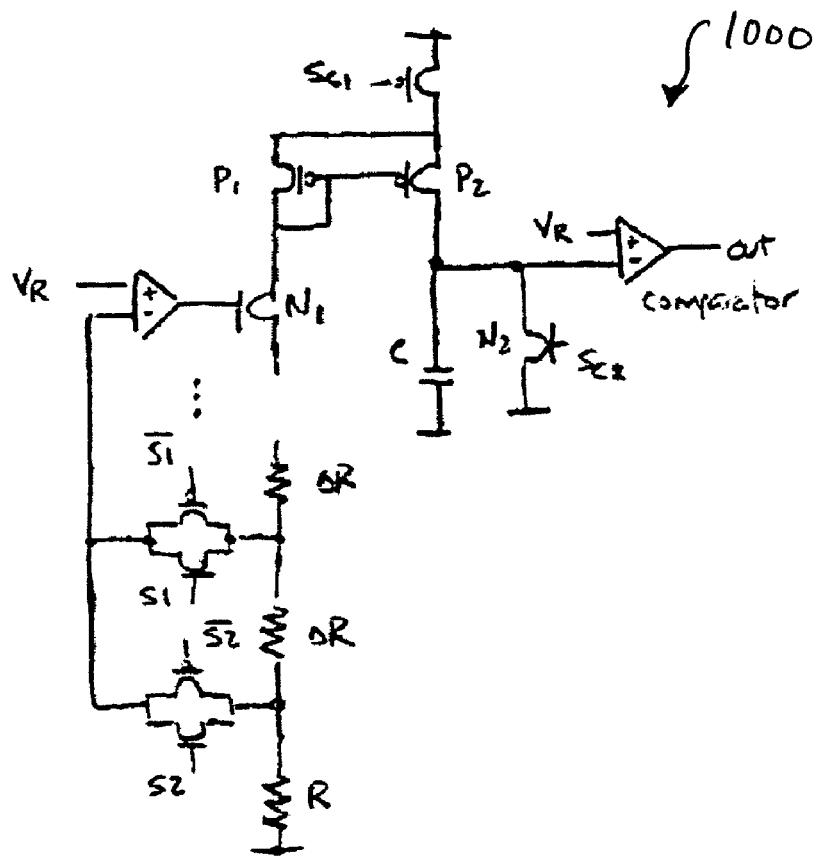
FIG. 10 shows one embodiment of a calibration circuit used to adjust the zero/pole locations for a PLL's active loop filter.

FIG. 10 shows a calibration circuit 1000 used to calibrate the RC product of the active integration filter 900 shown in FIG. 9. The calibration circuit 1000 is similar to the calibration circuit 500 of FIG. 5. It differs slightly to keep the switches at the same potential as resistor $R_1$ (and its switches) in the active loop filter. This is important since the on resistance of the switches varies with bias voltage. Furthermore, complimentary switches are usually needed to minimize the on resistance of the switches, especially if $V_R$ lies midway between $V_+$ and ground. Otherwise, the calibration algorithm operates as before.

Figure 11:
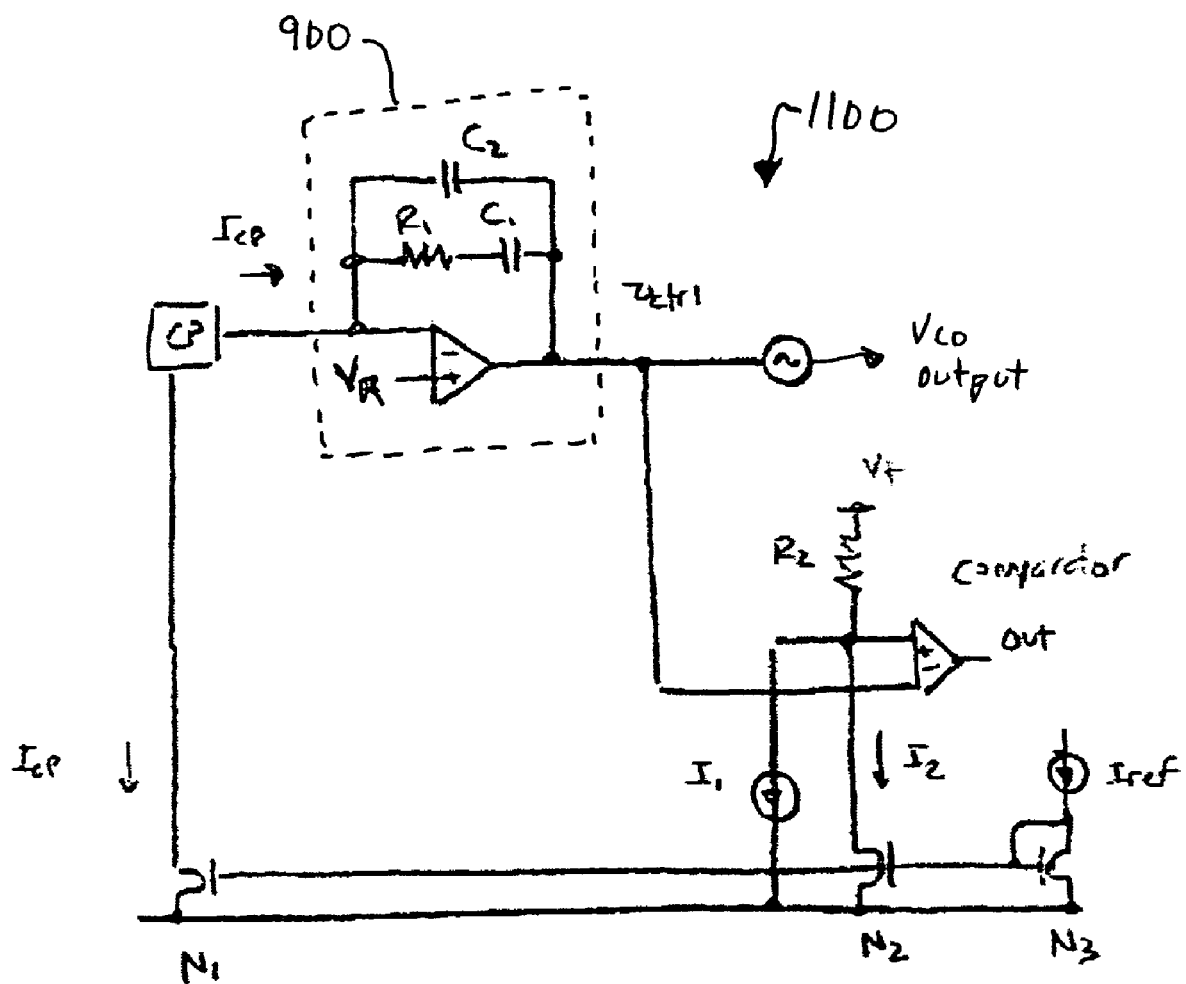
FIG. 11 shows one embodiment of a calibration circuit used to adjust the loop gain and associated parameters of the PLL with active loop filter.

FIG. 11 shows one embodiment of a calibration circuit 1100 used to calibrate the loop gain of a phase-locked loop. The circuit 1100 operates in situ (i.e., as in FIG. 7) and comprises the active integration filter 900 shown in FIG. 9. The calibration algorithm for constant loop gain also remains unchanged from that described with reference to FIG. 7.

The accuracy of the calibration algorithm depends on the value of the feedback counter N (not shown in FIG. 11) and varies with different phase-locked loop architectures. To improve precision, the programmable charge pump current $I_{CP}$ can be adjusted to compensate for changes in the value of N according to;

$$\Delta I_{CP} = \left(\frac{f_{vco} - f_{cal}}{f_{cal}}\right)I_{CP}$$

where $f_{cal}$ is the frequency where the calibration is performed. This allows the loop gain to remain constant even if the value of the feedback counter changes significantly.

Figure 12:
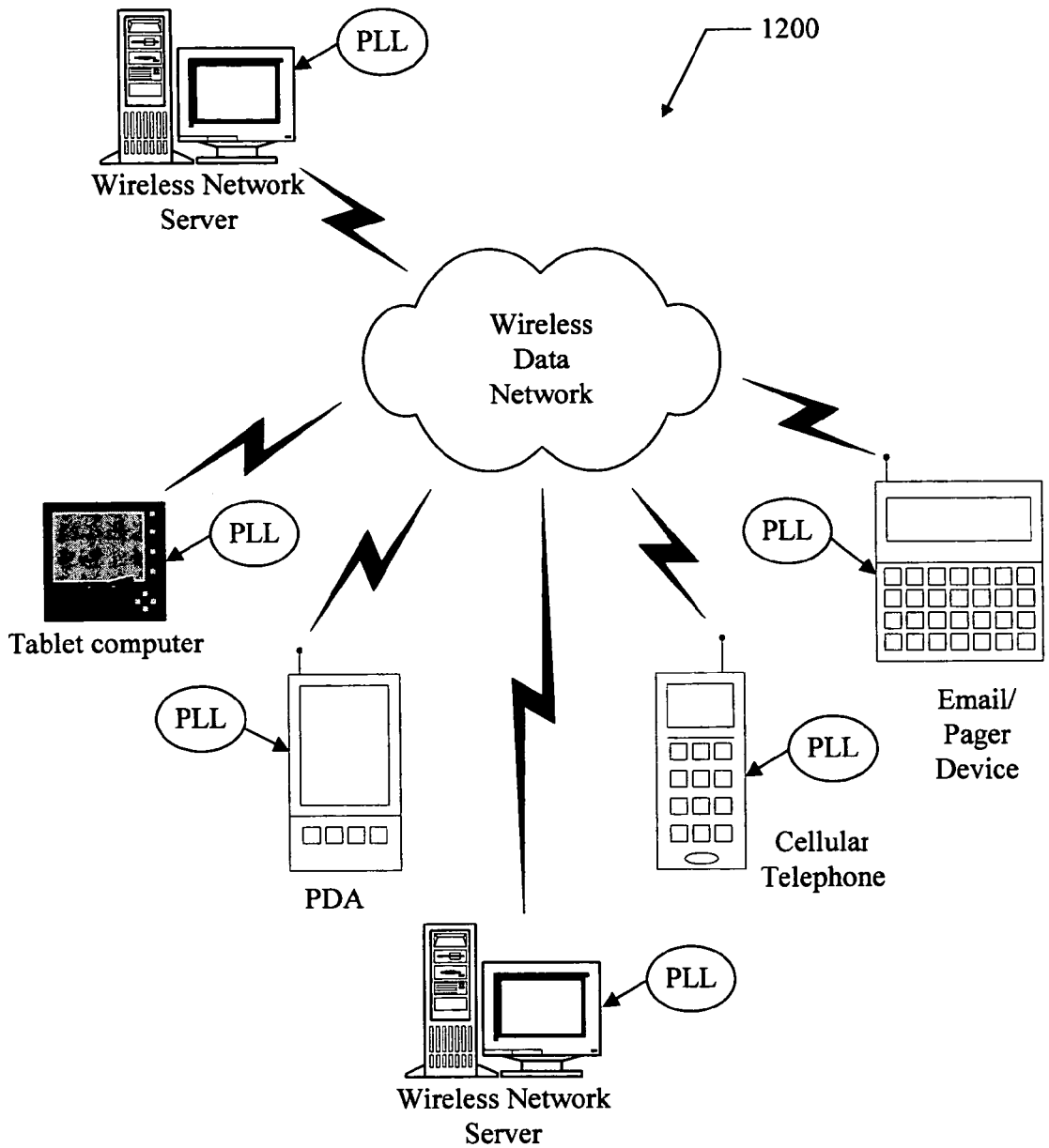
FIG. 12 shows a communication network that includes various communication devices that include one or more embodiments of a PLL calibration system.

FIG. 12 shows a communication network 1200 that includes various communication devices that include one or more embodiments of a PLL calibration system. The network 1200 includes multiple network servers, a tablet computer, a personal digital assistant (PDA), a cellular telephone, and an email/pager device all communicating over a wireless data network. Each of the devices includes one or more embodiments of a PLL calibration system as described herein. The network 1200 illustrates only some of the devices that may comprise one or more embodiments of a PLL calibration system. However, it should be noted that one or more embodiments of a PLL calibration system are suitable for use in virtually any type of communication device.

In one or more embodiments, a PLL calibration system is provided that automatically calibrates the parameters of a phase-locked loop and thereby optimize its performance. Accordingly, while one or more embodiments of a PLL calibration system have been illustrated and described herein, it will be appreciated that various changes can be made to the embodiments without departing from their spirit or essential characteristics. Therefore, the disclosures and descriptions herein are intended to be illustrative, but not limiting, of the scope of the invention, which is set forth in the following claims.

What is claimed is:

1. Apparatus for calibration of a phase-locked loop including a frequency divider, the apparatus comprising:
   logic to automatically calibrate an integration filter of the phase-locked loop based on a predefined filter transfer function, wherein said calibration is independent of the frequency divider parameters and the integration filed is calibrated by setting the value of one or more components of the integration filter to achieve a desired RC product set to achieve a predefined RC time constant, wherein the components include a resistive component and a capacitive component and the resistive component is set to achieve the desired RC product based on the value of the capacitive component, and wherein the logic to automatically calibrate an integration filter includes:
   a plurality of resistive elements;
   a plurality of switches configured to couple ones of the plurality of resistive elements to a charging current circuit;
   a first transistor coupled to a first of the plurality of resistive elements;
   an amplifier circuit coupled to the first transistor, said amplifier circuit configured to fix a charging current based on a reference voltage; and
   logic to automatically calibrate a charge pump current of the phase-locked loop, wherein the integration filter and charge pump current are calibrated to achieve a desired phase-locked loop performance level.

2. The apparatus of claim 1 wherein the plurality of switches are controlled by a switching circuit configured to adjust said plurality of switches responsive to the predefined RC time constant.

3. The apparatus of claim 2 wherein the logic to automatically calibrate an integration filter further comprises:
   a current mirror circuit coupled to the first transistor; and
   a comparator coupled to the current mirror; said comparator configured to receive a reference voltage and a capacitance voltage and provide an output signal to the switching circuit.

4. A method for precision calibration of a phase locked loop comprising the steps of:
   automatically calibrating the pole and zero locations of a phase locked loop integration filter to a desired transfer function; and
   automatically calibrating the charge pump current of a charge pump circuit based at least in part on the calibrated pole and zero location parameters, wherein said charge pump calibration is based on a desired transfer function; wherein said automatically calibrating the pole and zero locations of a phase locked loop integration filter to a desired transfer function comprises:
   setting a variable resistive element of the integration filter to a first value;
   comparing an RC time constant of the variable resistive element and a capacitive element to a reference time constant; and
   adjusting the value of the variable resistive element responsive to said comparing.

5. The method of claim 4 further comprising repeating said comparing and adjusting if the value of the RC time constant does not match the reference time constant.

6. The method of claim 5 wherein said adjusting comprises incrementing the value of the variable resistive element.

7. The method of claim 5 wherein said comparing an RC time constant comprises:
   setting a charge current based on the value of the variable resistive element;
   charging the capacitive element for a predetermined time period at the charge current; and
   comparing the voltage of the capacitive element to a reference voltage.

8. The Apparatus of claim 1 wherein the logic to calibrate the charge pump current of the phase-locked loop comprises logic to:
   determine the gain of a VCO element (Kvco) of the phase-locked loop; and
   set the charge pump current so that the charge pump current-Kvco product matches a predetermined value.

9. The method of claim 4 wherein the automatically calibrating the charge pump current of a charge pump circuit comprises:
   determining the gain of a VCO element (Kvco) of the phase-locked loop; and
   setting the charge pump current so that the charge pump current-Kvco product matches a predetermined value.

10. A method for calibrating a phase-locked loop, comprising:
    setting a resistor value of a resistor component of an integration filter of the PLL to establish a predefined RC time constant for the integration filter; and
    adjusting, after setting the resistor value, the open-loop gain of the PLL to replicate a control voltage step of a VCO component of the PLL developed at a first VCO frequency and a second VCO frequency.

11. The method of claim 10 wherein the control voltage is sensed and replicated by a comparator circuit.

12. The method of claim 10 wherein a charge pump current level of a charge pump component of the PLL is set based on said control voltage step.

13. The method of claim 10 wherein the resistor value is set at least in part to provide a predefined damping ratio.

* * * * *